(12) United States Patent
Yin et al.

(10) Patent No.: US 10,510,845 B2
(45) Date of Patent: Dec. 17, 2019

(54) METHOD FOR MANUFACTURING ELECTRODE OF SEMICONDUCTOR DEVICE

(71) Applicant: Silergy Semiconductor Technology (Hangzhou) Ltd., Hangzhou (CN)

(72) Inventors: Dengping Yin, Hangzhou (CN); Shijun Wang, Hangzhou (CN); Fei Yao, Hangzhou (CN)

(73) Assignee: SILERGY SEMICONDUCTOR TECHNOLOGY (HANGZHOU) LTD., Hangzhou (CN)

( * ) Notice: Subject to any disclaimer, the term of this patent is extended or adjusted under 35 U.S.C. 154(b) by 0 days.

(21) Appl. No.: 15/728,160

(22) Filed: Oct. 9, 2017

(65) Prior Publication Data
US 2018/0102413 A1    Apr. 12, 2018

(30) Foreign Application Priority Data
Oct. 11, 2016   (CN) .......................... 2016 1 0885936

(51) Int. Cl.
*H01L 21/283* (2006.01)
*H01L 29/40* (2006.01)
(Continued)

(52) U.S. Cl.
CPC ........ *H01L 29/401* (2013.01); *H01L 21/0272* (2013.01); *H01L 21/283* (2013.01);
(Continued)

(58) Field of Classification Search
None
See application file for complete search history.

(56) References Cited

U.S. PATENT DOCUMENTS 9,887,155 B2* 2/2018 Liu ...................... H01L 23/522
2009/0026624 A1* 1/2009 Lee ................... H01L 21/28556
257/762

(Continued)

FOREIGN PATENT DOCUMENTS

CN    103413762 A    11/2013
CN    104576323 A    4/2015
(Continued)

OTHER PUBLICATIONS

Jin et al. "Micropatterning of Polymethacrylates by Single- or Two-Photon Irradiation Using _-Conjugated o-Nitrobenzyl Ester Phototrigger as Side Chains" Journal of Applied Polymer Science 2013 pp. 4099-4106.*
(Continued)

*Primary Examiner* — Bradley Smith
(74) *Attorney, Agent, or Firm* — Westman, Champlin & Koehler, P.A.

(57) ABSTRACT

The invention disclosed a method for manufacturing an electrode of a semiconductor device, comprising: forming a first interlayer dielectric layer having a first opening on a first surface of a semiconductor substrate; forming a first resist mask having a second opening on a surface of the first interlayer dielectric layer, wherein the first opening and the second opening are connected to form a first stacked opening; forming a first conductive layer on the first resist mask, wherein the first conductive layer comprises a first portion being located on a surface of the first resist mask and a second portion being located inside the first stacked opening; and removing the first resist mask, wherein the first portion of the first conductive layer is removed together with the first resist mask, and the second portion of the first conductive layer is retained as a first surface electrode.

17 Claims, 6 Drawing Sheets

(51) Int. Cl.
*H01L 23/00* (2006.01)
*H01L 21/027* (2006.01)
(52) U.S. Cl.
CPC .............. *H01L 24/00* (2013.01); *H01L 24/03* (2013.01); *H01L 2224/03472* (2013.01); *H01L 2224/06181* (2013.01)

(56) References Cited

U.S. PATENT DOCUMENTS

| | | | | |
|---|---|---|---|---|
| 2009/0026634 | A1* | 1/2009 | Sakurai | H01L 24/10 257/778 |
| 2011/0101527 | A1* | 5/2011 | Cheng | H01L 24/11 257/738 |
| 2012/0145668 | A1* | 6/2012 | Riege | G03F 1/38 216/41 |
| 2013/0069233 | A1* | 3/2013 | Chou | H01L 21/768 257/751 |
| 2017/0018430 | A1 | 1/2017 | Peng | |

FOREIGN PATENT DOCUMENTS

| | | |
|---|---|---|
| CN | 104952734 A | 9/2015 |
| CN | 105742403 A | 7/2016 |

OTHER PUBLICATIONS

Office Action, including Search Report, for Chinese Patent Application No. 201610885936.6, dated Jul. 30, 2018, 10 pages.
Pearton, S.J. et al., "Nanoscale Devices and Novel Engineered Materials", Dec. 15, 1995-Sep. 1, 1996, http://www.phys.ufl.edu/~nanoscale/reports/year1/liftoff.html, 6 pages.

* cited by examiner

- Prior Art -

- Prior Art -

- Prior Art -

- Prior Art -

- Prior Art -

- Prior Art -

METHOD FOR MANUFACTURING ELECTRODE OF SEMICONDUCTOR DEVICE

CROSS-REFERENCE TO RELATED APPLICATION

This application claims the benefit of Chinese Patent Application No. 201610885936.6, filed on Oct. 11, 2016, which is incorporated herein by reference in its entirety.

BACKGROUND OF THE DISCLOSURE

Field of the Disclosure

The present disclosure relates to a method for manufacturing a semiconductor device, and in particular, to a method for manufacturing an electrode of a semiconductor device.

Background of the Disclosure

Some semiconductor devices, such as ESD devices with high ESD protection performance, require using Ag or Sn electrodes with very good electrical conductivity as surface electrodes of the ESD devices, and moreover, the electrodes are usually required to be manufactured on both of the front and back sides of the semiconductor devices.

In the prior art, single-side photolithographic process is often used to fabricate electrodes of semiconductor devices, as shown in FIGS. 1a to 1f. The FIGS. 1a to 1f are cross-sectional diagrams illustrating a conventional method for manufacturing an electrode of a semiconductor device at different steps.

As shown in FIG. 1a, a first interlayer dielectric layer 120 and a second interlayer dielectric layer 121 are formed on the front and back sides of a semiconductor substrate 110, respectively, and then a first opening and a second opening are respectively formed on the first interlayer dielectric layer 120 and the second interlayer dielectric layer 121 by patterning the first interlayer dielectric layer 120 on the front side of the semiconductor substrate 110 and the second interlayer dielectric layer 121 on the back side of the semiconductor substrate 110, an active region of the semiconductor substrate 110 is exposed partly outside through the first opening and the second opening, and the exposed portion of the active region of the semiconductor substrate 110 is a contact region of an electrode. Next, a first conductive layer 130 and a second conductive layer 131 are respectively formed on the first interlayer dielectric layer 120 on the front side of the semiconductor substrate 110 and the second interlayer dielectric layer 121 on the back side of the semiconductor substrate 110, a resist agent is applied on the surface of the first conductor layer 130 to form a first resist mask 140 and then the first resist mask 140 is exposed and developed.

Next, as shown in FIG. 1b, the portion of the first conductive layer 130 being exposed by the first resist mask 140 is etched.

Next, as shown in FIG. 1c, the first resist mask 140 being remained on the front side of the semiconductor substrate 110 is removed, and the remained portion of the first conductive layer 130 is used as a first surface electrode.

Next, as shown in FIG. 1d, the second conductive layer 131 is formed on the second interlayer dielectric layer 121 on the back side of the semiconductor substrate 110 by using a same method with the method described above. The resist agent is applied to the surface of the second conductive layer 131 to form a second resist mask 141, and the second resist mask 141 is exposed and developed.

Next, as shown in FIG. 1e, the portion of the second conductive layer 131 exposed by the second resist mask 141 is etched.

Finally, as shown in FIG. 1f, the second resist mask 141 remained on the back side of the semiconductor substrate 110 is removed, and the remained portion of the second conductive layer 131 is used as a second surface electrode. As a result, the double-side surface electrodes of the semiconductor device are completed.

In the prior art, chemical agent such as a strong acid or a strong base is often used when the semiconductor layer is etched, so that when one side of the semiconductor substrate is etched according to the conventional technology, the electrode already fabricated on the other side of the semiconductor substrate will be damage.

SUMMARY OF THE DISCLOSURE

The technical problem to be solved in the disclosure is to provide a method for manufacturing an electrode of a semiconductor device, which can solve the problem that in the conventional method for manufacturing the electrode of the semiconductor device, when one side of the semiconductor substrate is etched, the chemical agent will often damage the electrode already fabricated on the other side of the semiconductor substrate.

To solve the above technical problem, the disclosure provides the method for manufacturing the electrode of the semiconductor device, comprising: forming a first interlayer dielectric layer having a first opening on a first surface of a semiconductor substrate;

forming a first resist mask having a second opening on a surface of the first interlayer dielectric layer, wherein the first opening and the second opening are connected to form a first stacked opening;

forming a first conductive layer on the first resist mask, wherein the first conductive layer comprises a first portion being located on a surface of the first resist mask and a second portion being located inside the first stacked opening; and removing the first resist mask, wherein the first portion of the first conductive layer is removed together with the first resist mask, and the second portion of the first conductive layer is retained as a first surface electrode.

Preferably, the semiconductor substrate comprises an active region, the step of forming the first interlayer dielectric layer having the first opening on the first surface of the semiconductor substrate comprises:

forming the first interlayer dielectric layer on the first surface of the semiconductor substrate;

forming a second resist mask having the first opening on the surface of the first interlayer dielectric layer;

forming the first interlayer dielectric layer having the first opening by etching the first interlayer dielectric layer through the first opening; and removing the second resist mask, wherein an exposed portion of the active region of the semiconductor substrate is exposed to the outside through the first opening, and the exposed portion of the active region of the semiconductor substrate is used as a first electrode contact region.

Preferably, in the process of forming the first resist mask having the second opening, constant exposure energy is used for forming the second opening with steep sidewalls.

Preferably, in the process of forming the first resist mask having the second opening, exposure energy increasing progressively with time is used for forming the second opening with sidewalls expanding with depth.

Preferably, the second opening is larger than the first opening and the first opening is fully exposed through the second opening.

Preferably, the first interlayer dielectric layer has a first thickness, the first resist mask has a second thickness, the first conductive layer has a third thickness, the third thickness is less than a sum of the first thickness and the second thickness, and an upper surface of the second portion of the first conductive layer is lower than an upper surface of the first resist mask.

Preferably, the third thickness is greater than the first thickness, and the second portion of the first conductive layer fills the first opening, and laterally extends on the first interlayer dielectric layer.

Preferably, the method further comprises: forming a second interlayer dielectric layer having a third opening on a second surface of the semiconductor substrate, wherein the second surface is opposed to the first surface;

forming a third resist mask having a fourth opening on a surface of the second interlayer dielectric layer, wherein the third opening and the fourth opening are connected to form a second stacked opening;

forming a second conductive layer on the third resist mask, wherein the second conductive layer comprises a first portion being located on a surface of the third resist mask and a second portion being located inside the second stacked opening; and removing the third resist mask, wherein the first portion of the second conductive layer is removed together with the third resist mask, and the second portion of the second conductive layer is retained as a second surface electrode.

Preferably, the semiconductor substrate comprises an active region, the step of forming the second interlayer dielectric layer having the third opening on the second surface of the semiconductor substrate comprises: forming the second interlayer dielectric layer on the second surface of the semiconductor substrate; forming a fourth resist mask having the third opening on the surface of the second interlayer dielectric layer; forming the second interlayer dielectric layer having the third opening by etching the second interlayer dielectric layer through the third opening; and removing the fourth resist mask, wherein an exposed portion of the active region of the semiconductor substrate is exposed to the outside through the third opening, and the exposed portion of the active region of the semiconductor substrate is used as a second electrode contact region.

Preferably, the second interlayer dielectric layer and the first interlayer dielectric layer are formed simultaneously.

Preferably, in the process of forming the third resist mask having the fourth opening, constant exposure energy is used for forming the fourth opening with steep sidewalls.

Preferably, in the process of forming the third resist mask having the fourth opening, exposure energy increasing progressively with time is used for forming the fourth opening with sidewalls expanding with depth.

Preferably, the fourth opening is larger than the third opening and the third opening is fully exposed through the fourth opening.

Preferably, the second interlayer dielectric layer has a first thickness, the third resist mask has a second thickness, the second conductive layer has a third thickness, the third thickness is less than the sum of the first thickness and the second thickness, and an upper surface of the second conductive layer is lower than an upper surface of the third resist mask.

Preferably, the third thickness is greater than the first thickness, and the second portion of the second conductive layer fills the third opening, and laterally extends on the second interlayer dielectric layer.

The technical scheme of the present disclosure can effectively avoid the problem that the first surface electrode which has been formed is damaged while the second interlayer dielectric layer is being etched.

BRIEF DESCRIPTION OF THE DRAWINGS

The above and other objects, advantages and features of the present invention will become more fully understood from the detailed description given hereinbelow in connection with the appended drawings, and wherein:

The FIGS. 1a to 1f are cross-sectional diagrams illustrating a conventional method for manufacturing an electrode of a semiconductor device at different steps;

Figure 1A:
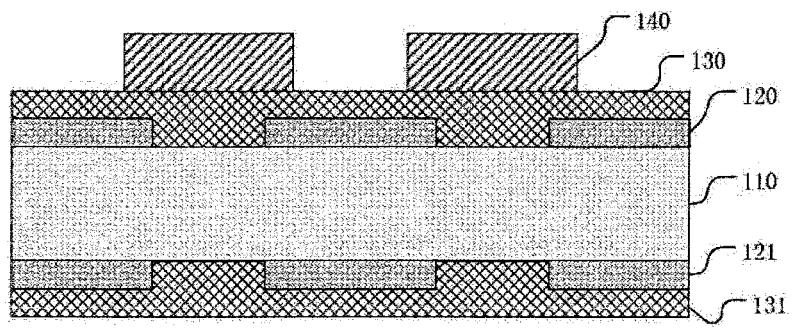
Figure 1B:
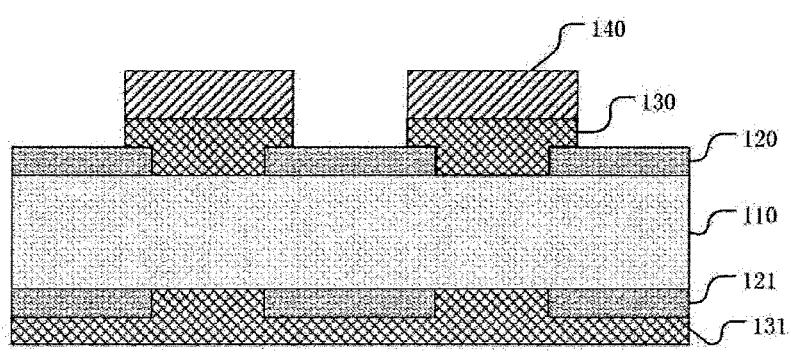
Figure 1C:
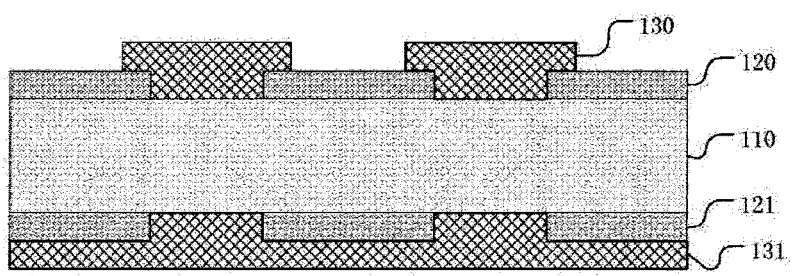
Figure 1D:
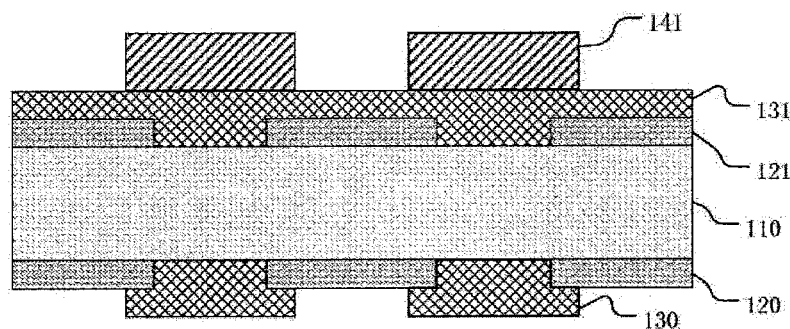
Figure 1E:
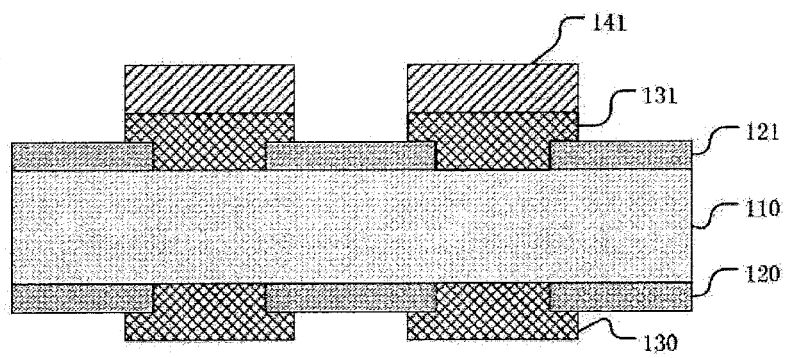
Figure 1F:
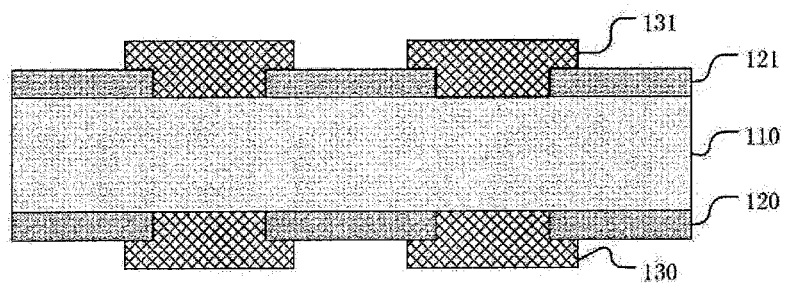

The FIGS. 2a to 2e are cross-sectional diagrams illustrating a method for manufacturing an electrode of a semiconductor device at different steps according to a first embodiment; and The FIGS. 3a to 3e are cross-sectional diagrams illustrating a method for manufacturing an electrode of a semiconductor device at different steps according to a second embodiment.

DETAILED DESCRIPTION OF THE DISCLOSURE

Exemplary embodiments of the present disclosure will be described in more details below with reference to the accompanying drawings. In the drawings, like reference numerals denote like members. The figures are not drawn to scale, for the sake of clarity. Moreover, some well-known parts may not be shown in figures.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure.

In a first embodiment, there is provided a method for manufacturing an electrode of a semiconductor device, and the detail can refer to FIGS. 2a to 2e. The FIGS. 2a to 2e are cross-sectional diagrams illustrating the method for manufacturing the electrode of the semiconductor device at different steps according to the first embodiment.

Particularly, in the embodiment, there is provided a method for manufacturing a double-side electrode of a semiconductor device, and in practice, the method is also applicable to the fabrication of a single-side electrode, the detailed steps of which can refer to the embodiment.

Figure 2A:
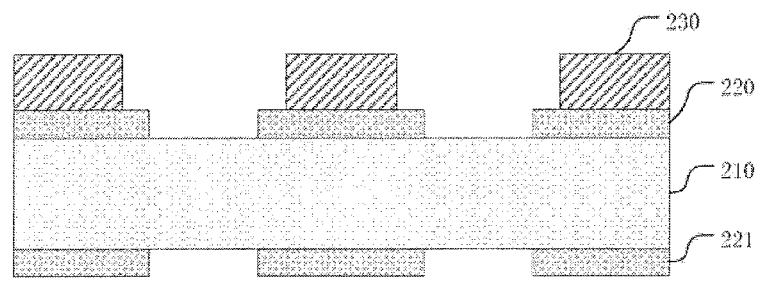

As shown in FIG. 2a, first, a semiconductor substrate 210, for example Si wafer, is provided.

Preferably, a first interlayer dielectric layer 220 and a second interlayer dielectric layer 221 are simultaneously formed on a first surface and a second surface of the semiconductor substrate 210, and the first interlayer dielectric layer 220 and the second interlayer dielectric layer 221 have a first thickness, and the first interlayer dielectric layer 220 and the second interlayer dielectric layer 221 are, for example, $SiO_2$ layers. The first surface and the second surface are opposed to each other.

Next, a resist agent is applied on the surfaces of the first interlayer dielectric layer 220 and the second interlayer dielectric layer 221 to form a second resist mask and a fourth resist mask, respectively, the resist agent is, for example, photoresist. The second resist mask on the first surface of the semiconductor substrate 210 and the fourth resist mask on the second surface of the semiconductor substrate 210 are exposed and developed by use of single-side light, to form a first opening of the second resist mask and a third opening of the fourth resist mask, thereby exposing a portion of the first interlayer dielectric layer 220 corresponding to the first opening and a portion of the second interlayer dielectric layer 221 corresponding to the third opening.

Further, the first interlayer dielectric layer 220 on the first surface of the semiconductor substrate 210 and the second interlayer dielectric layer 221 on the second surface of the semiconductor substrate 210 are patterned separately. In the embodiment, the first interlayer dielectric layer 220 on the first surface of the semiconductor substrate 210 and the second interlayer dielectric layer 221 on the second surface of the semiconductor substrate 210 are etched by use of a dry etching process, to form the first interlayer dielectric layer 220 having the first opening and the second interlayer dielectric layer 220 having the third opening, a portion of the active region of the semiconductor substrate 210 is exposed to the outside through the first and third openings, the exposed portion of the active region of the semiconductor substrate 210 is used as a first electrode contact region and a second electrode contact region. Finally, the second resist mask and the fourth resist mask are removed.

It should be noted that the step of patterning the second interlayer dielectric layer 221, i.e., etching the second interlayer dielectric layer 221, can be carried out before the step of patterning the first interlayer dielectric layer 220, or performed after the fabrication of the first surface electrode, or performed between the above two steps. The specific processing sequence should not limit the disclosure.

Next, a resist agent is applied on a surface of the first interlayer dielectric layer 220 to form a first resist mask 230 and the first resist mask 230 is exposed and developed by use of a single-side light source, which provides a constant exposure energy (i.e., an ultraviolet light with constant light intensity and wavelength), the second opening with steep sidewalls is formed in the first resist mask 230, that means, the first resist mask 230 with the second opening is formed, which has a second thickness. The second opening and the first opening are connected to form a first stacked opening, the second opening is larger than the first opening, the first opening is fully exposed through the second opening, and a portion of the surface of the first interlayer dielectric layer 220 is not covered by the first resist mask 230 and is exposed to the outside.

Figure 2B:
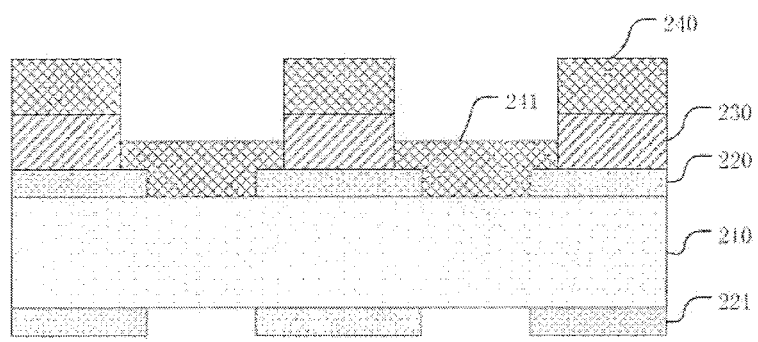

Further, as shown in FIG. 2b, a first conductive layer is formed on the first resist mask 230, the first conductive layer has a third thickness. Preferably, the third thickness is smaller than the sum of the first thickness and the second thickness, and the third thickness is larger than the first thickness.

The first conductive layer includes a first portion 240 and a second portion 241, the first portion 240 of the first conductive layer covers the surface of the first resist mask 230, and the second portion 241 of the first conductive layer fills the first stacked opening. Because the width of the second opening is larger than that of the first opening and the third thickness is smaller than the sum of the first thickness and the second thickness and larger than the first thickness, the second portion 241 of the first conductive layer not only fills the first opening but also laterally extends on the first interlayer dielectric layer 220 and fills a portion of the second opening. And moreover, the upper surface of the second portion 241 of the first conductive layer is lower than the upper surface of the first resist mask 230.

Next, the first resist mask 230 is removed. Because the first portion 240 of the first conductive layer is formed on the surface of the first resist mask 230, the first portion 240 of the first conductive layer is removed together while the first resist mask 230 is removed, and the second portion 241 of the first conductive layer is retained.

Figure 2C:
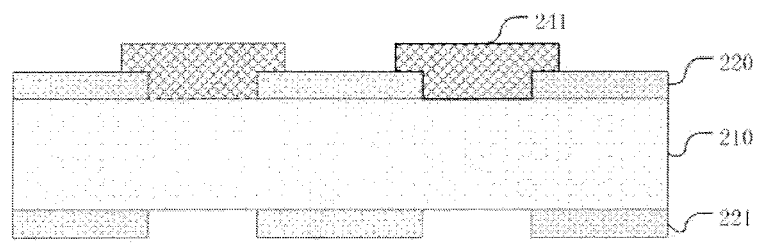

FIG. 2c shows the cross-sectional diagram after the removal of the first resist mask 230. In FIG. 2c, the second portion 241 of the first conductive layer is the first surface electrode of the semiconductor substrate 210.

Figure 2D:
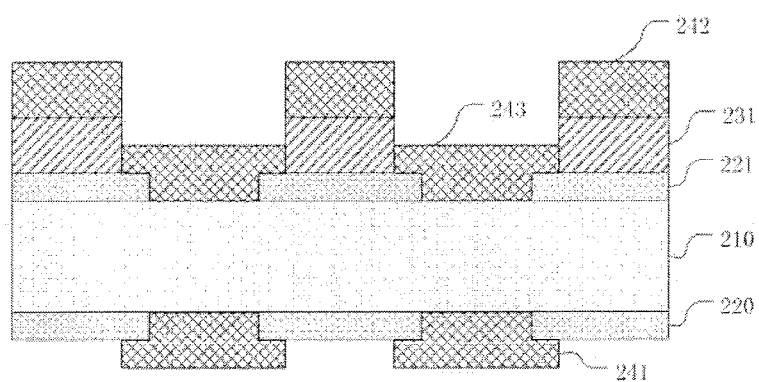

Next, as shown in FIG. 2d, a second surface electrode is formed on the second surface of the semiconductor substrate 210. The method for manufacturing the second surface electrode is the same as that for manufacturing the first surface electrode, and it is not repeated here.

Figure 2E:
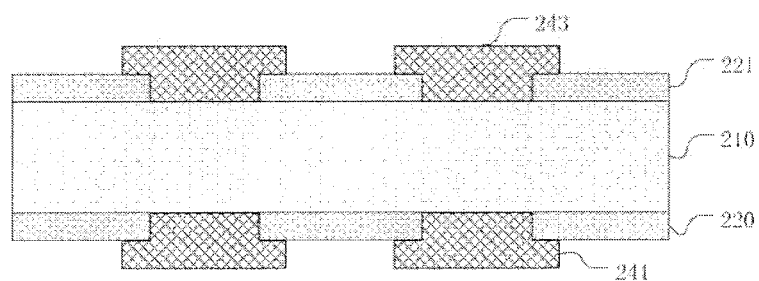

The final semiconductor device having double surface electrodes can refer to the FIG. 2e.

In the first embodiment of the disclosure, the etching treatment is not necessarily performed with a chemical agent such as a strong acid or a strong base while the first portion of the second conductive layer formed on the second surface of the semiconductor substrate is being removed, so that the first surface electrode already formed on the first surface of the semiconductor substrate will not be damaged.

The method for manufacturing an electrode of a semiconductor device provided by the second embodiment can refer to FIGS. 3a to 3e. The FIGS. 3a to 3e are cross-sectional diagrams illustrating the method for manufacturing the electrode of the semiconductor device at different steps according to the second embodiment.

Figure 3A:
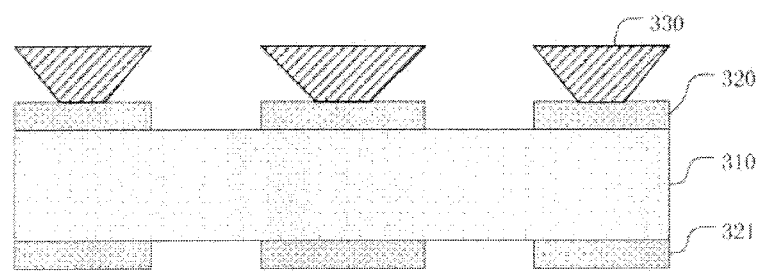

As shown in FIG. 3a, first, a semiconductor substrate 310, for example a Si wafer, is provided.

Preferably, a first interlayer dielectric layer 320 and a second interlayer dielectric layer 321 are simultaneously formed on a first surface and a second surface of the semiconductor substrate 310, and the first interlayer dielectric layer 320 and the second interlayer dielectric layer 321 have a first thickness, and the first interlayer dielectric layer 320 and the second interlayer dielectric layer 321 are, for example, $SiO_2$ layers. The second surface and the first surface are opposed to each other.

Next, a resist agent is applied on the surfaces of the first interlayer dielectric layer 320 and the second interlayer dielectric layer 321 to form a second resist mask and a fourth resist mask, respectively, the resist agent is, for example, a photoresist. The second resist mask on the first surface of the semiconductor substrate 310 and the fourth resist mask on the second surface of the semiconductor substrate 310 are exposed by use of single-side light, to form the second resist mask having a first opening and the fourth resist mask having a third opening, so that the portion of the first interlayer dielectric layer 320 corresponding to the first opening is exposed, and the portion of the second interlayer layer 321 corresponding to the third opening is exposed. Further, the first interlayer dielectric layer 320 on the first surface of the semiconductor substrate 310 and the second interlayer dielectric layer on the second surface of the semiconductor substrate 310 are patterned separately. In the embodiment, the first interlayer dielectric layer 320 on the first surface of the semiconductor substrate 310 and the second interlayer dielectric layer 321 on the second surface of the semiconductor substrate 310 are etched by use of a dry etching process, to form the first interlayer dielectric layer 320 with the first opening and the second interlayer dielectric layer 321 with the third opening, portions of the active regions of the semiconductor substrate 310 are exposed to the outside through the first and third openings, the exposed portions of the active regions of the semiconductor substrate 310 are respectively used as a first electrode contact region and a second electrode contact region. Finally, the second resist mask and the fourth resist mask are removed.

It should be emphasized that the step of patterning the second interlayer dielectric layer 321, i.e., etching the second interlayer dielectric layer 321, can be carried out before the step of patterning the first interlayer dielectric layer 320, or performed after the fabrication of the first surface electrode, or performed between the above two steps. The specific processing sequence should not limit the disclosure.

Next, a resist agent is applied on a surface of the first interlayer dielectric layer 320 to form a first resist mask 330 and the first resist mask 330 is exposed and developed by use of a single-side light source, which provides an exposure energy increasing progressively with time, that is, an ultraviolet light with increasing light intensity or decreasing wavelength. Because the first resist mask 330 is exposed faster and faster due to the increasing exposure energy, the second opening formed on the first resist mask 330 expands with depth. Referring to FIG. 3a, the first resist mask 330 has an inverted trapezoidal structure, of which the upper portion is larger than the lower portion, and the first resist mask 330 has a second thickness. The second opening and the first opening are connected to form a first stacked opening. The second opening is larger than the first opening, the first opening is fully exposed through the second opening, and the surface of the first interlayer dielectric layer 320 has one portion which is not covered by the first resist mask 330 and exposed to the outside.

Figure 3B:
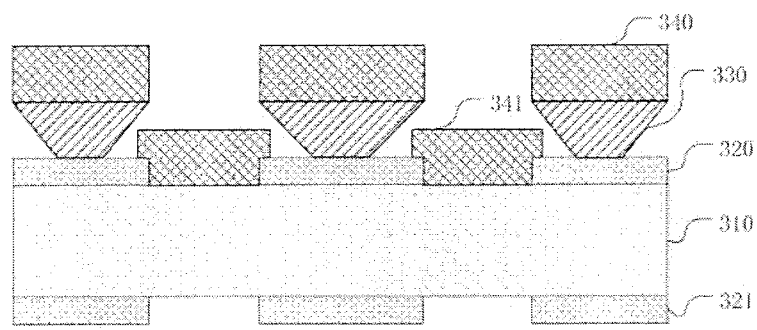

Further, as shown in FIG. 3b, the first conductive layer is formed, the first conductive layer has a third thickness. Preferably, the third thickness is smaller than the sum of the first thickness and the second thickness and lager than the first thickness.

The first conductive layer includes a first portion 340 and a second portion 341, the first portion 340 of the first conductive layer covers the surface of the first resist mask 330, and the second portion 341 of the first conductive layer fills the first stacked opening. Because the width of the second opening is larger than the width of the first opening and the third thickness is smaller than the sum of the first thickness and the second thickness and lager than the first thickness, the second portion 341 of the first conductive layer not only fills the first opening but also extends laterally on the first dielectric layer 320 and partly fills the second portion. The upper surface of the second portion 341 of the first conductive layer is lower than the upper surface of the first resist mask 330.

Further, the first resist mask 330 is removed. Because the first portion 340 of the first conductor layer is formed on the surface of the first resist mask 330, the first portion 340 of the first conductive layer is removed together with the first resist mask 330, and the second portion 341 of the first conductor layer is retained.

Figure 3C:
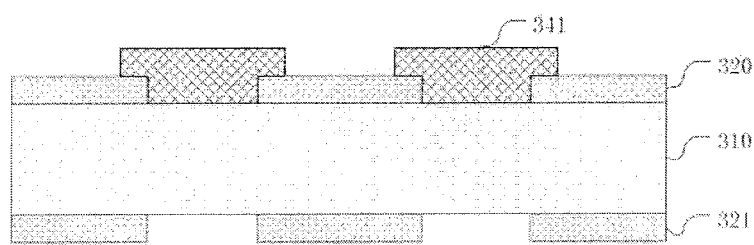

The cross-sectional diagram of the device after the removal of the first resist mask 330 can refer to the FIG. 3c. In the FIG. 3c, the second portion 341 of the first conductive layer is the first surface electrode of the semiconductor substrate 310.

Figure 3D:
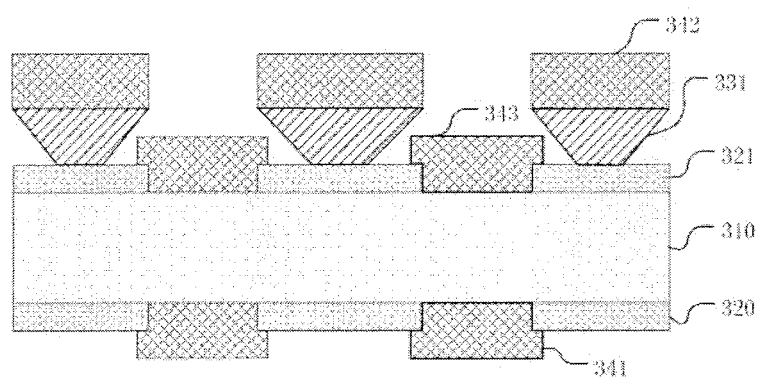

Further, as shown in FIG. 3d, a second surface electrode is formed on the second surface of the semiconductor substrate 310. The method for manufacturing the second surface electrode on the semiconductor substrate 310 is the same as that for manufacturing the first surface electrode, and it is not repeated here.

Figure 3E:
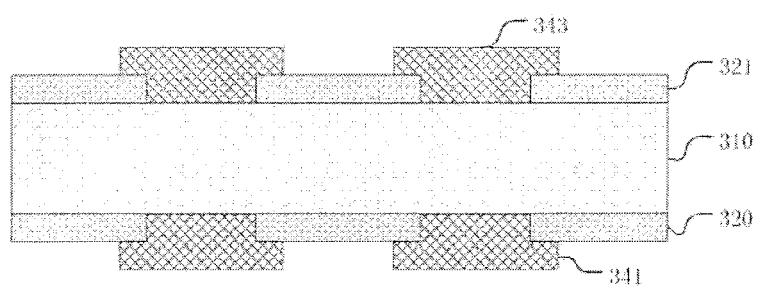

The final semiconductor device having double-side surface electrodes can refer to the FIG. 3e.

In the second embodiment of the disclosure, while the first portion of the second conductive layer formed on the second surface of the semiconductor substrate is removed, the etching treatment with a chemical agent such as a strong acid or a strong base is not necessary, so that the first surface electrode having been formed on the first surface of the semiconductor substrate will not be damaged Moreover, as shown in FIG. 3b, because the exposure energy is increased progressively with time, the second opening of the first resist mask 330 formed on the first surface of the semiconductor substrate 310 expands with depth, and the first resist mask 330 has an inverted trapezoidal structure, of which the upper portion is larger than the lower portion, there is a gap between the second portion 341 of the first conductive layer and the first resist mask 330, so that the first resist mask 330 is removed more easily, and similarly, the second surface of the semiconductor substrate 310 also achieves the same effect.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element. If there is no explicit limitation, the wording "comprise a/an . . . " does not exclude the fact that other elements can also be included together with the process, approach, article or apparatus relevant to the element.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

The invention claimed is:

1. A method for manufacturing an electrode of a semiconductor device, comprising:

forming a first interlayer dielectric layer having a first opening on a first surface of a semiconductor substrate, wherein said first surface of said semiconductor substrate is partly exposed by the first opening;

forming a first resist mask having a second opening on a surface of said first interlayer dielectric layer by exposure with a light source which provides an ultraviolet light, wherein said first opening and said second opening are connected to form a first stacked opening;

forming a first conductive layer on said first resist mask, wherein said first conductive layer comprises a first portion being located on a surface of said first resist mask and a second portion being located inside said first stacked opening;

removing said first resist mask, wherein said first portion of said first conductive layer is removed together with said first resist mask, and said second portion of said first conductive layer is retained as a first surface electrode;

forming a second interlayer dielectric layer having a third opening on a second surface of said semiconductor substrate, wherein said second surface of said semiconductor substrate is partly exposed by the third opening; and forming a second conductive layer, wherein portion of said second conductive layer fills said third opening and is retained as a second surface electrode, wherein said second portion of said first conductive layer fills a portion of said second opening of said first resist mask, and said second surface is opposed to said first surface.

2. The method according to claim 1, wherein said semiconductor substrate comprises an active region, said step of forming said first interlayer dielectric layer having said first opening on said first surface of said semiconductor substrate comprises:

forming said first interlayer dielectric layer on said first surface of said semiconductor substrate;

forming a second resist mask having said first opening on said surface of said first interlayer dielectric layer;

forming said first interlayer dielectric layer having said first opening by etching said first interlayer dielectric layer through said first opening; and removing said second resist mask, wherein an exposed portion of said active region of said semiconductor substrate is exposed to the outside through said first opening, and said exposed portion of said active region of said semiconductor substrate is used as a first electrode contact region.

3. The method according to claim 1, in the process of forming said first resist mask having said second opening, said light source provides an ultraviolet light with constant light intensity and constant wavelength for forming said second opening with steep sidewalls.

4. The method according to claim 1, wherein said second opening is larger than said first opening and said first opening is fully exposed through said second opening.

5. The method according to claim 1, wherein said first interlayer dielectric layer has a first thickness, said first resist mask has a second thickness, said first conductive layer has a third thickness, said third thickness is less than a sum of said first thickness and said second thickness, and an upper surface of said second portion of said first conductive layer is lower than an upper surface of said first resist mask.

6. The method according to claim 5, wherein said third thickness is greater than said first thickness, and said second portion of said first conductive layer fills said first opening, and laterally extends on said first interlayer dielectric layer.

7. The method according to claim 1, further comprising:

forming a third resist mask having a fourth opening on a surface of said second interlayer dielectric layer, wherein said third opening and said fourth opening are connected to form a second stacked opening, said second conductive layer comprises a first portion being located on a surface of said third resist mask and a second portion being located inside second stacked opening; and removing said third resist mask, wherein said first portion of said second conductive layer is removed together with said third resist mask, and said second portion of said second conductive layer is retained as a second surface electrode.

8. The method according to claim 7, wherein said semiconductor substrate comprises an active region, the step of forming said second interlayer dielectric layer having said third opening on said second surface of said semiconductor substrate comprises:

forming said second interlayer dielectric layer on said second surface of said semiconductor substrate;

forming a fourth resist mask having said third opening on said surface of said second interlayer dielectric layer;

forming said second interlayer dielectric layer having said third opening by etching said second interlayer dielectric layer through said third opening; and removing said fourth resist mask, wherein an exposed portion of said active region of said semiconductor substrate is exposed to the outside through said third opening, and the exposed portion of said active region of said semiconductor substrate is used as a second electrode contact region.

9. The method according to claim 7, wherein said second interlayer dielectric layer and said first interlayer dielectric layer are formed simultaneously.

10. The method according to claim 7, wherein, in the process of forming said third resist mask having said fourth opening, said light source provides an ultraviolet light with constant light intensity and constant wavelength for forming said fourth opening with steep sidewalls.

11. The method according to claim 7, wherein said fourth opening is larger than said third opening and said third opening is fully exposed through said fourth opening.

12. The method according to claim 7, wherein said second interlayer dielectric layer has a first thickness, said third resist mask has a second thickness, said second conductive layer has a third thickness, said third thickness is less than a sum of said first thickness and said second thickness, and an upper surface of said second conductive layer is lower than an upper surface of said third resist mask.

13. The method according to claim 12, wherein said third thickness is greater than said first thickness, and said second portion of said second conductive layer fills said third opening, and laterally extends on said second interlayer dielectric layer.

14. The method according to claim 1, wherein said first resist mask is formed from a photoresist mask partially exposed to said light source, said second opening is configured to expand with depth towards said surface of said first interlayer dielectric layer.

15. The method according to claim 7, wherein said third resist mask is formed from a photoresist mask partially exposed to said light source, said fourth opening is configured to expand with depth towards said surface of said second interlayer dielectric layer.

16. The method according to claim 1, wherein said first interlayer dielectric layer on said first surface of said semiconductor substrate and said second interlayer dielectric layer on said second surface of said semiconductor substrate are patterned by single-side light separately.

17. A method for manufacturing an electrode of a semiconductor device, comprising:

forming a first interlayer dielectric layer having a first opening on a first surface of a semiconductor substrate;

forming a first resist mask having a second opening on a surface of said first interlayer dielectric layer by exposure with a light source which provides an ultraviolet light, wherein said first opening and said second opening are connected to form a first stacked opening;

forming a first conductive layer on said first resist mask, wherein said first conductive layer comprises a first portion being located on a surface of said first resist mask and a second portion being located inside said first stacked opening;

removing said first resist mask, wherein said first portion of said first conductive layer is removed together with said first resist mask, and said second portion of said first conductive layer is retained as a first surface electrode;

forming a second interlayer dielectric layer having a third opening on a second surface of said semiconductor substrate, wherein said second surface is opposed to said first surface;

forming a third resist mask having a fourth opening on a surface of said second interlayer dielectric layer, wherein said third opening and said fourth opening are connected to form a second stacked opening;

forming a second conductive layer on said third resist mask, wherein said second conductive layer comprises a first portion being located on a surface of said third resist mask and a second portion being located inside said second stacked opening; and removing said third resist mask, wherein said first portion of said second conductive layer is removed together with said third resist mask, and said second portion of said second conductive layer is retained as a second surface electrode, wherein said second portion of said first conductive layer fills a portion of said second opening of said first resist mask.

* * * * *